US 6,620,699 B2

(12) United States Patent
Scholz et al.

(10) Patent No.: US 6,620,699 B2
(45) Date of Patent: Sep. 16, 2003

(54) METHOD FOR FORMING INSIDE NITRIDE SPACER FOR DEEP TRENCH DEVICE DRAM CELL

(75) Inventors: Arnd Scholz, Poughkeepsie, NY (US); Prakash C. Dev, Plano, TX (US)

(73) Assignee: Infineon Technologies North America Corp., San Jose, CA (US)

(*) Notice: Subject to any disclaimer, the term of this patent is extended or adjusted under 35 U.S.C. 154(b) by 0 days.

(21) Appl. No.: 09/967,226

(22) Filed: Sep. 28, 2001

(65) Prior Publication Data

US 2003/0062557 A1 Apr. 3, 2003

(51) Int. Cl.[7] ............................................. H01L 21/20
(52) U.S. Cl. ..................... 438/386; 438/391; 438/243; 438/248
(58) Field of Search ................................. 438/386, 391, 438/243, 248; 257/296, 301

(56) References Cited

U.S. PATENT DOCUMENTS 6,008,104 A * 12/1999 Schrems ...................... 438/386
6,339,241 B1 * 1/2002 Mandelman et al. ......... 257/301

OTHER PUBLICATIONS

E. Sahouria, Y. Granik, N. Cobb, and O. Toublan, "FullChip Process Simulation for Silicon DRC," Technology Report, Mentor Graphics Corp., San Jose, CA (2000) pp. 1–4.*

H. Baumgartner, V. Fuenzalida, and I. Eisele, "Ozone Cleaning of the Si—SiO(2) System," Applied Physics A, vol.43, (1987) pp. 223–226.*

Maki Suemitsu, Tetsuya Kaneko, and Nobut Miyamoto, "Low Temperature Silicon Surface Cleaning by HF Etching/Ultraviolet Ozone Cleaning (HF/UVOC) Method (I)—Optimization of the HF Treatment," Jap. Jour. of Applied Phys., vol.28, No. 12, (1987) pp. 2421–2424.*

* cited by examiner

Primary Examiner—Tom Thomas
Assistant Examiner—Thomas Magee

(57) ABSTRACT

A method is provided for forming an inside nitride spacer in a deep trench device DRAM cell. The method includes depositing an oxide liner in a trench etched from a semiconductor material, wherein the oxide lines abuts a pad nitride layer, a pad oxide layer under the pad nitride layer, and a recessed gate poly in the trench. The method further includes depositing a spacer material on the oxide liner, removing exposed portions of the oxide layer from the semiconductor, and depositing a poly stud material over the semiconductor wherein the spacer material is encapsulated in poly stud material. The method includes polishing the semiconductor to the top trench oxide layer, and etching the top trench oxide layer.

14 Claims, 4 Drawing Sheets

METHOD FOR FORMING INSIDE NITRIDE SPACER FOR DEEP TRENCH DEVICE DRAM CELL

BACKGROUND OF THE INVENTION

1. Field of the Invention

The present invention relates to semiconductor devices, and more particularly to a deep trench inside nitride spacer for trench-sidewall vertical device DRAM cells.

2. Discussion of Prior Art

The development of trench-sidewall vertical device dynamic random access memory (DRAM) cells has revealed various problems. For example, trench-sidewall vertical device DRAM cells need space, therefore high-density cells have been difficult to achieve. Further trench-sidewall vertical device DRAM cells have been prone to bitline shorts.

Poor wordline-bitline yield in trench-sidewall vertical device DRAM cells has limited the study of cell concepts with respect to vertical array devices. In a trench-sidewall vertical device DRAM cell, wordlines run directly over the gate poly of the vertical device, which is buried in the top part of the trench. Since the wordline is typically about 30% narrower than the top width of the trench, the wordline does not cap the trench completely. Assuming a perfect wordline to deep trench alignment, even after the spacer is put in place the top of the vertical gate poly is unprotected and can contact the bitline contact.

Planar array device technologies include nitride spacers to protect the sidewall of the gate conductor line. The top deep trench width is typically larger than the gate conductor line width. Deep trench spacer formation includes a recess etch, a spacer deposition and etch and a poly refill and planarization. These steps are performed at the end of the deep trench method and the poly stud is planarized to the pad nitride level. Since there is another planarization step at the end of the isolation trench process, which consumes some pad nitride, the spacer nitride may become a part of the surface. Thus, the spacer nitride is stripped with the pad nitride strip. A refill and etchback process is needed to fill seams and voids.

These seams and voids become more problematic at smaller ground rules, as they degrade the integrity of the device, and may reduced the retention time of the trench capacitor, adversely impacting the performance of the device.

Therefore, a need exists for an inside nitride spacer for deep trench device DRAM cells which is conserved during device formation.

SUMMARY OF THE INVENTION

According to an embodiment of the present invention, a method is provided for forming an inside nitride spacer in a deep trench device DRAM cell. The method includes depositing an oxide liner in a trench etched from a semiconductor material, wherein the oxide lines abuts a pad nitride layer, a pad oxide layer under the pad nitride layer, and a recessed gate poly in the trench. The method further includes depositing a spacer material on the oxide liner, removing exposed portions of the oxide layer from the semiconductor, and depositing a poly stud material over the semiconductor wherein the spacer material is encapsulated in poly stud material. The method includes polishing the semiconductor to the top trench oxide layer, and etching the top trench oxide layer.

The method includes etching the spacer to below a top surface of the pad nitride prior to depositing the poly stud material.

Removing exposed portions of the oxide layer further comprises performing an ozone cleaning.

Etching the top trench oxide layer exposes the spacer. The method includes forming a wordline over the gate poly, and forming a gate conductor spacer adjacent to the wordline, having a width overlapping the spacer, wherein the spacer substantially prevents a bitline contact from contacting the gate poly material in the trench.

The spacer is conserved during a formation of active area components. The spacer material is deposited on the oxide liner at a depth in the semiconductor material and a height greater than the semiconductor material.

According to an embodiment of the present invention, a method is provided for forming an inside nitride spacer in a deep trench device DRAM cell. The method includes depositing an oxide liner in a trench etched from a semiconductor material, wherein the oxide abuts a pad nitride layer, a pad oxide layer under the pad nitride layer, and a recessed gate poly in the trench. The method further includes depositing a spacer material on the semiconductor, etching the spacer to below a top surface of the pad nitride, and performing an ozone cleaning to remove exposed portions of the oxide layer from the semiconductor. The method includes depositing a poly stud material over the semiconductor wherein the trench is filled with the poly stud material, polishing the semiconductor to the top trench oxide layer, and etching the top trench oxide payer.

Etching the top trench oxide layer exposes the spacer. The method includes forming a wordline over the gate poly, and forming a gate conductor spacer adjacent to the wordline, having a width overlapping the spacer, wherein the spacer substantially prevents a bitline contact from contacting the gate poly material in the trench.

The spacer is conserved during a formation of the active area. The spacer material is deposited on the oxide liner at a depth in the semiconductor material and a height greater than the semiconductor material.

According to an embodiment of the present invention, a deep trench vertical dynamic access memory semiconductor device is provided including an oxide liner in an upper portion of a trench, a vertical gate poly filling a portion of the trench, and a spacer, formed on the oxide liner prior to and conserved during an active area process, for preventing contact between the vertical gate poly and a bitline contact.

The spacer overlaps a gate conductor spacer according to a critical distance and an overlay tolerance.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

The present invention provides a system and method for isolating a bitline contact from an adjacent wordline. The method integrates a deep trench inside nitride spacer into a trench sidewall of a vertical device DRAM cell. The deep trench top inside spacer is conserved during an active area (AA) process. The method prevents the bitline contact from connecting to the vertical gate poly Silicon (Si). The method produces a deep trench top nitride spacer, which is not removed by an etch with the pad nitride strip, e.g., conserved during an AA process. Therefore, no refill is needed because no seem or void is created.

To avoid this contact or shorting mechanism, a spacer is placed in the top part of the deep trench. This spacer is designed to have a desirable overlap with a gate conductor spacer for all allowed critical dimensions (CD) and overlay tolerances.

Since a deep trench is oversized with respect to its design value the possible contact area for a corresponding bitline contact is already reduced. The deep trench spacer can be on the inside or the outside of the deep trench. Spacer material can include, for example, nitride. Nitride has desirable selectivity for the bitline contact etch. The width of the spacer is chosen so that a desirable overlap of the gate conductor spacer with the deep trench inside spacer is achieved for all allowed CD and overlay tolerances. If the gate conductor etch has sufficient overetch into the gate poly, a foldback effect for the gate conductor spacer can be assumed, which reduces the amount of the deep trench inside spacer needed.

According to an embodiment of the present invention, the spacer is conserved during the pad nitride strip. Because of the spacer is conserved no additional steps are needed, for example, to refill a void left after spacer material has been etched from a device.

A spacer etch pulls down the shoulder of the deep trench top spacer with respect to the pad nitride level. Thus, after the poly stud fill and planarization, poly Si encapsulates the spacer nitride. The poly Si prevents the spacer from being etched during a pad nitride strip.

Figure 1:
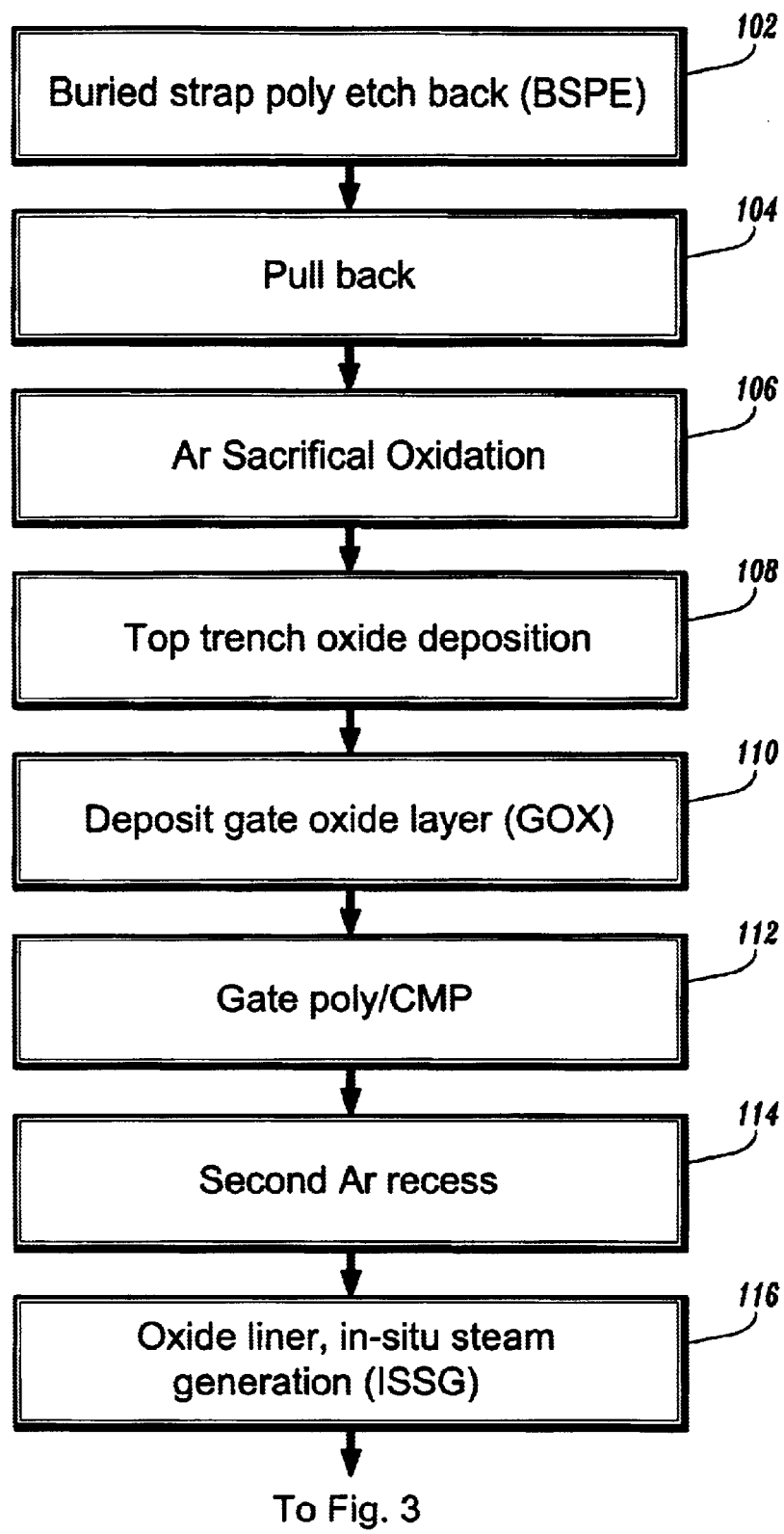
FIG. 1 is a flow chart of a method according to an embodiment of the present invention.

Referring to FIG. 1, a method for forming a deep trench vertical DRAM includes a buried strap poly etch back 102 to form a deep trench capacitor. The method includes a pull back 104 and an array sacrificial oxidation 106. A top trench oxide is grown over the surface of the semiconductor 108. A gate poly oxide layer is grown over the top trench oxide 110. A chemical mechanical polish removes portions of the gate poly oxide layer 112 and a second array recess is performed 114. An oxide liner is grown 116 via in-situ steam generation.

Figure 2:
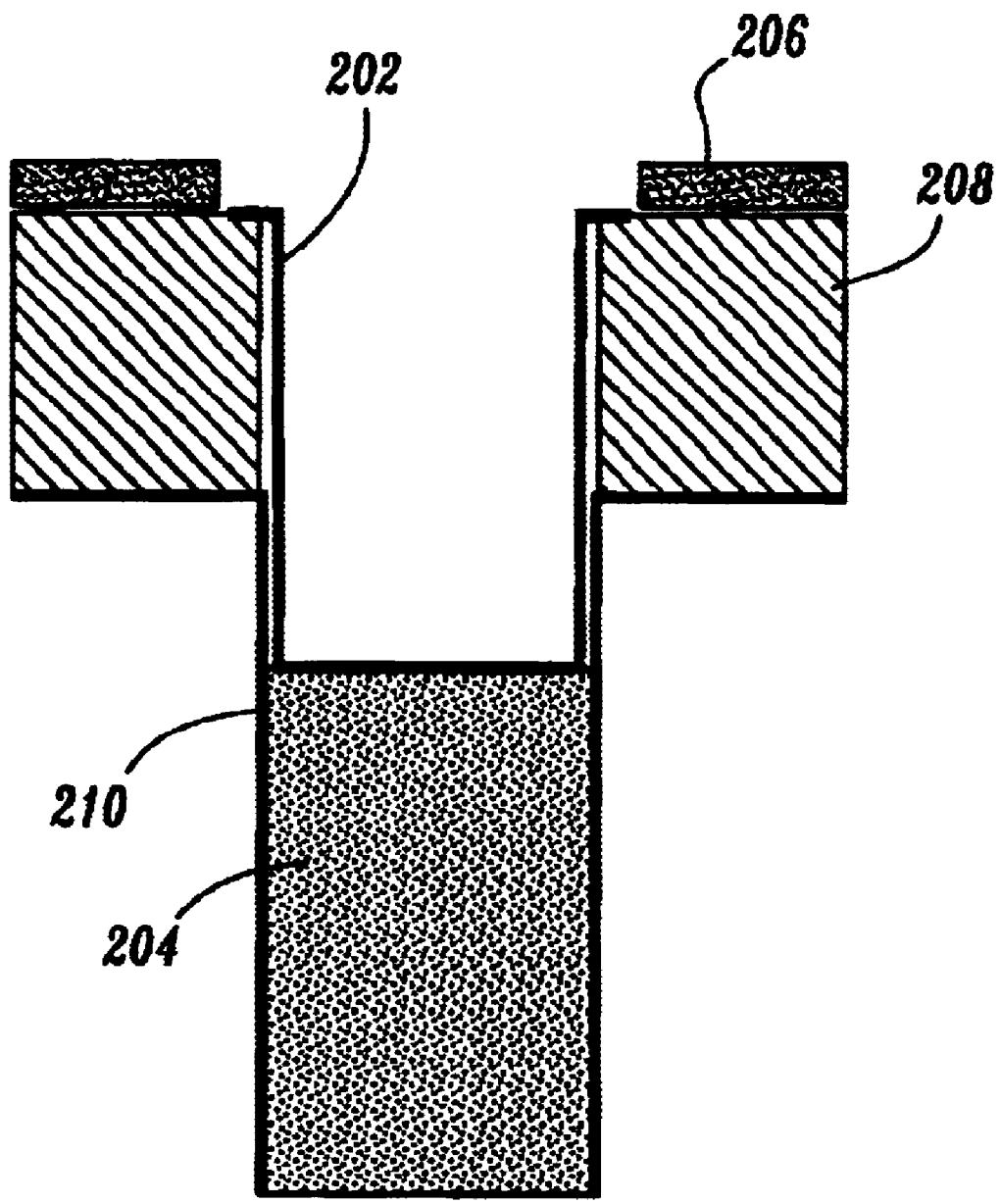
FIG. 2 is a diagram of a cross-section of a trench-sidewall vertical device DRAM cell according to an embodiment of the present invention.

As shown in FIG. 2, an oxide liner 202 is formed on the trench walls and covers a recessed gate poly 204 in the trench. A top trench oxide 206 covers a pad nitride layer 208. A portion of the trench walls are formed of pad oxide 210.

Figure 3:
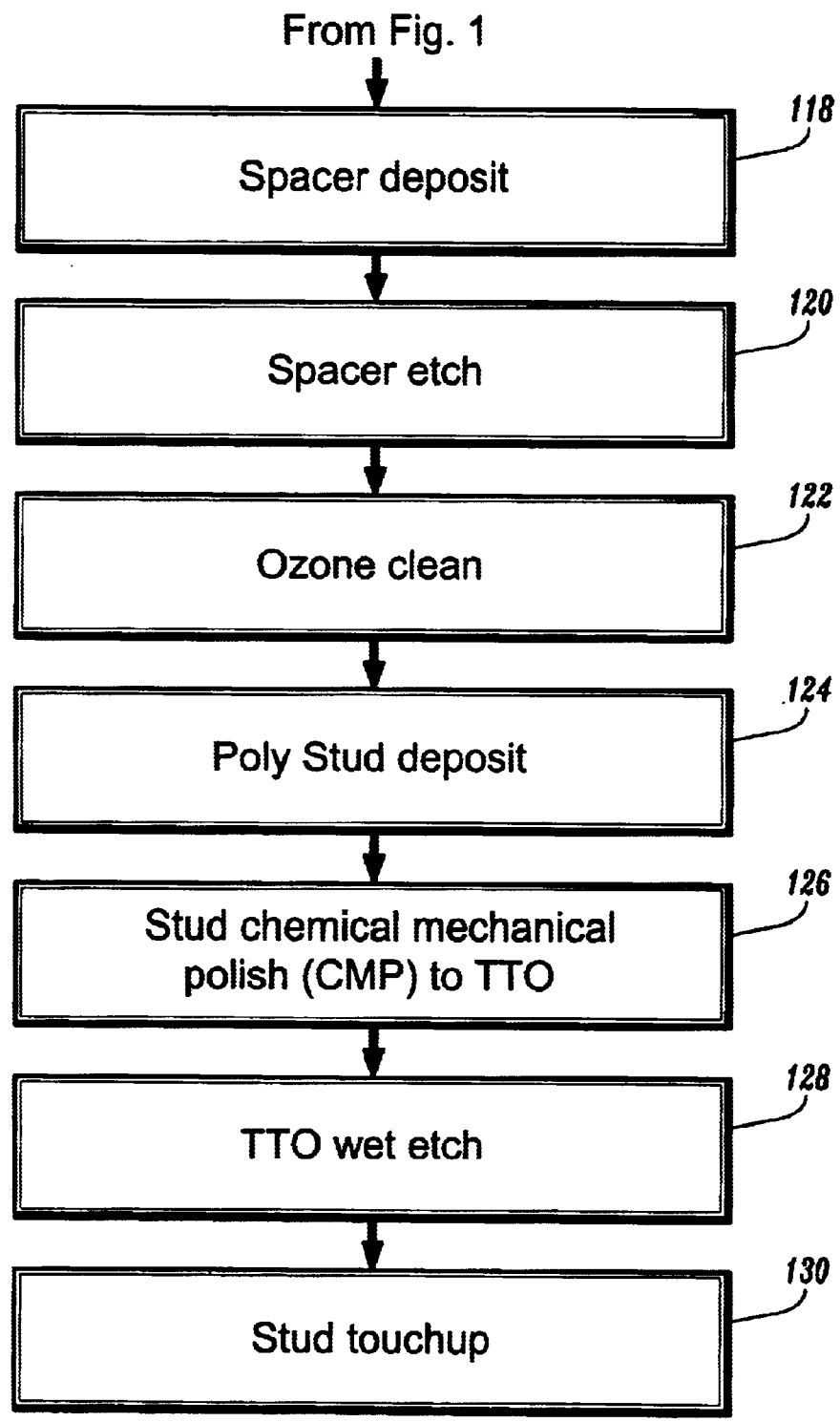
FIG. 3 is a continuation of FIG. 1, according to an embodiment of the present invention.

According to FIG. 3, a spacer is deposited along the surface of the trench 118 and etched 120 down to the shoulder of the spacer, sufficiently below the pad nitride surface. This will assure that the spacer has always some poly Si on top. The side of the spacer towards the pad nitride is protected by the oxide liner, which is put down before the spacer nitride deposition. The oxide liner also protects the corner of the pad nitride around the trench at the spacer etch. This is the only area where the pad nitride is exposed to the spacer etch, remaining portion of the pad nitride surface is protected by the top trench oxide. An ozone cleaning 122 is implemented, for example, UV-ozone clean for removing photoresist and other organic films from the wafer surface. UV-ozone cleans oxidize bare silicon and the oxide that is formed may be removed by, for example, an HF-vapor process. A poly study is deposited 124 and the excess portions are removed by CMP down to the top trench oxide 126. The top trench oxide is set etched 128 (e.g., gate conductor etch), for example, by a wet etch, to expose the pad nitride. A stud touchup 130 is performed to level the poly stud to the level of the pad nitride.

Figure 4:
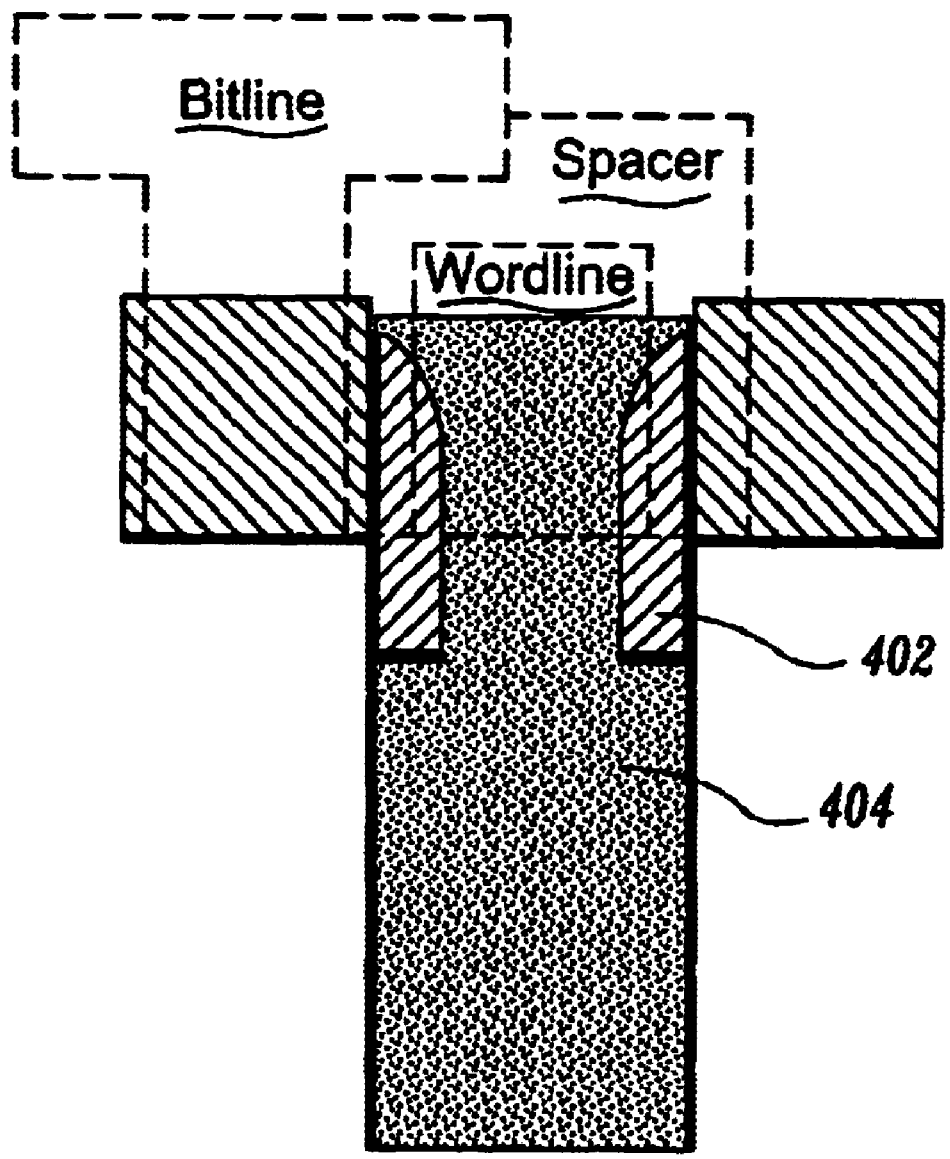
FIG. 4 is a diagram of a cross-section of a trench-sidewall vertical device DRAM cell including a deep trench inside nitride spacer according to an embodiment of the present invention.

As shown in FIG. 4, the system and method are designed to encapsulate the spacer 402 in oxide or poly Si 404. This encapsulation will assure that the spacer cannot be stripped out with the pad nitride strip. Therefore, no divot refill and etch back is needed. The spacer 402 stands higher then the Si substrate, allowing a gate conductor etch to remove the poly Si of the deep trench stud on top of the spacer nitride. The pad oxide layer and the oxide liner, as well as the poly stud, prevent the spacer from being etched by the gate conductor etch.

Having described embodiments for a system and method for integrating an inside nitride spacer into a deep trench DRAM device, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A method for forming an inside nitride spacer in a deep trench device DRAM cell comprising the steps of:

depositing an oxide liner in a trench etched from a substrate and a pad nitride layer deposited over the substrate, wherein a pad oxide layer lines the trench and underlies the pad nitride layer, and wherein the oxide liner covers a recessed gate poly in the trench;

depositing a spacer material on the oxide liner wherein a portion of the oxide liner covering the recessed gate poly is exposed in the trench;

removing the exposed portion of the oxide liner from the recessed gate poly in the trench;

filling the trench with a poly stud material, wherein the spacer material is encapsulated in the poly stud material; and stripping the pad nitride layer, wherein the spacer encapsulated in the poly stud material is conserved.

2. The method of claim 1, further comprising the step of etching the spacer to below a top surface of the pad nitride prior to depositing the poly stud material.

3. The method of claim 1, wherein the step of removing the exposed portion of the oxide liner further comprises performing an ozone cleaning.

4. The method of claim 1, further comprising the steps of:

forming a wordline over the gate poly, wherein the gate poly comprises the poly stud material; and the forming a gate conductor spacer adjacent to the wordline, having a width overlapping spacer material, wherein the spacer material substantially prevents a bitline contact from contacting the gate poly material in the trench.

5. The method of claim 1, wherein the spacer is conserved during a formation of active area components.

6. The method of claim 1, wherein the spacer material is deposited on the oxide liner at a depth in the semiconductor material and a height greater than the semiconductor material.

7. A method for forming an inside nitride spacer in a deep trench device DRAM cell comprising the steps of:
   depositing an oxide liner in a trench etched from a substrate and a pad nitride layer deposited over the substrate, wherein a pad oxide layer lines the trench and underlies the pad nitride layer, and wherein the oxide liner covers a recessed gate poly in the trench;
   depositing a spacer material on the oxide liner wherein a portion of the oxide liner covering the recessed gate poly is exposed in the trench;
   etching the spacer to below a top surface of the pad nitride;
   performing an ozone cleaning to remove the exposed portions of the oxide liner from the recessed gate poly in the trench;
   filling the trench with a poly stud material, wherein the spacer material is encapsulated in the poly stud material; and
   stripping the pad nitride layer, wherein the spacer encapsulated in the poly stud material is conserved.

8. The method of claim 7, further comprising the steps of:
   forming a wordline over the gate poly, wherein the gate poly comprises the poly stud material; and
   forming a gate conductor spacer adjacent to the wordline, having a width overlapping the spacer material, wherein the spacer material substantially prevents a bitline contact from contacting the gate poly material in the trench.

9. The method of claim 7, wherein the spacer is conserved during a formation of the active area.

10. The method of claim 7, wherein the spacer material is deposited on the oxide liner at a depth in the semiconductor material and a height greater than the semiconductor material.

11. A deep trench vertical dynamic access memory semiconductor device comprising:
   an oxide liner in an upper portion of a trench;
   a vertical gate poly filling a portion of the trench; and
   a spacer, formed on the oxide liner prior to and conserved during an active area process, for preventing contact between the vertical gate poly and a bitline contact.

12. The system of claim 11, wherein the spacer overlaps a gate conductor spacer according to a critical distance and an overlay tolerance.

13. The method of claim 1, further comprising the steps of:
   growing a top trench oxide over the pad nitride layer;
   depositing a gate poly oxide layer on the top trench oxide;
   removing, by chemical mechanical polish, a portion of the gate poly oxide layer;
   performing an array recess to clear a top portion of the trench; and
   etching the top trench oxide layer following filling the top portion of the trench with the poly stud material.

14. The method of claim 7, further comprising the steps of:
   growing a top trench oxide over the pad nitride layer;
   depositing a gate poly oxide layer on the top trench oxide;
   removing, by chemical mechanical polish, a portion of the gate poly oxide layer;
   performing an array recess to clear a top portion of the trench; and
   etching the top trench oxide layer following filling the top portion of the trench with the poly stud material.

* * * * *